(12) United States Patent
Teig et al.

(10) Patent No.: US 7,263,677 B1
(45) Date of Patent: Aug. 28, 2007

(54) METHOD AND APPARATUS FOR CREATING EFFICIENT VIAS BETWEEN METAL LAYERS IN SEMICONDUCTOR DESIGNS AND LAYOUTS

(75) Inventors: Steven Teig, Menlo Park, CA (US); Akira Fujimura, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 504 days.

(21) Appl. No.: 10/335,246

(22) Filed: Dec. 31, 2002

(51) Int. Cl.
 *G06F 17/50* (2006.01)
(52) U.S. Cl. .......................................... 716/8; 716/11
(58) Field of Classification Search ................. 716/2, 716/8, 11, 19
 See application file for complete search history.

(56) References Cited

U.S. PATENT DOCUMENTS

| | | | |
|---|---|---|---|
| 6,247,853 B1 * | 6/2001 | Papadopoulou et al. | 716/4 |
| 6,475,877 B1 * | 11/2002 | Saia et al. | 438/460 |
| 6,656,644 B2 * | 12/2003 | Hasegawa et al. | 430/5 |
| 6,769,099 B2 * | 7/2004 | Li et al. | 716/2 |
| 2003/0005399 A1 * | 1/2003 | Igarashi et al. | 716/8 |

* cited by examiner

*Primary Examiner*—Vuthe Siek
(74) *Attorney, Agent, or Firm*—Stattler Johansen & Adeli LLP

(57) ABSTRACT

A system for creating efficient vias between metal layers in semiconductor designs that employ diagonal wiring is disclosed. The system combines advantages of both octagonal shaped vias and square shaped vias. Specifically, octagonal shaped vias are ideal for integrated circuit layouts that contain diagonal wiring since the diagonal wiring may be placed closer to the center the via due to the bevel corners. However, octagonal vias are difficult to manufacture. Square vias have been traditionally used within integrated circuits and the techniques to manufacture square vias are well-known. Since the final manufactured output of an ideal square via is similar to the final output of an ideal octagonal via, one system that may be employed is to design an integrated circuit with octagonal vias and then replace those octagonal shaped vias with square vias just before manufacturing. The replacement square vias must be chose to produce an output shape that is very similar to the output of the ideal octagonal via.

17 Claims, 11 Drawing Sheets

METHOD AND APPARATUS FOR CREATING EFFICIENT VIAS BETWEEN METAL LAYERS IN SEMICONDUCTOR DESIGNS AND LAYOUTS

FIELD OF THE INVENTION

The present invention relates to the field of electronic semiconductor design and manufacture. In particular the present invention discloses methods for designing and manufacturing integrated circuit vias for carrying electrical signals between different metal layers in an integrated circuit.

BACKGROUND OF THE INVENTION

An integrated circuit ("IC") is a semiconductor device that includes many electronic components (e.g., transistors, diodes, inverters, etc.) manufactured on a small semiconductor die. These electrical components are interconnected to form larger scale circuit components (e.g., gates, cells, memory units, arithmetic units, controllers, decoders, etc.) on the IC. The electronic and circuit components of IC's are jointly referred to below as "components."

An integrated circuit also includes multiple layers of metal and/or polysilicon wiring that interconnect the various electronic and circuit components. For instance, many integrated circuits are currently fabricated with five metal layers. Most integrated circuits use the "Manhattan" wiring model, which specifies alternating layers of preferred-direction horizontal and vertical wiring. (Viewed from above, the horizontal and vertical wiring resemble the orthogonal streets of Manhattan.) In the Manhattan wiring model, essentially all of the interconnect wires are horizontal or vertical.

To connect electrical wiring on different metal layers, a "via" is used. A via is essentially a metal and/or polysilicon column that connects wiring on two different metal layers. Vias are generally created slightly larger than the wiring that will be connected in order to account for any misalignment between different semiconductor layers. In traditional Manhattan-wired semiconductors, the vias are designed as square geometric structures when viewed from above.

In order to reduce the amount of area on an integrated circuit dedicated to wiring and reduce the length (and thus propagation delay) of individual wires diagonal wiring systems have been introduced. In an integrated circuit that uses diagonal wiring, two pins that are separated by both a large vertical and horizontal distance from each other (using the Manhattan grid as a reference) can be coupled with a diagonal wire that is shorter that the sum of horizontal wire and a vertical wire that would be required in a Manhattan routed integrated circuit.

Diagonal wiring has proven to be a method creating smaller integrated circuit designs. Due to the reduced size, the yields on diagonally wired integrated circuits may be better than similar but larger Manhattan wired integrated circuits. Furthermore, since diagonally wired integrated circuits have shorter wiring runs, diagonally wired integrated circuits may operate at higher speeds.

As previously set forth, interconnect wires on different metal layers are traditionally connected together with square vias. However, square vias may not prove to be optimal for a diagonally wired integrated circuit. For example, the corners of a square shaped via do not provide much help in connecting wires those corners may cause design rule violations by being too close to nearby diagonal wires. It would therefore be desirable to determine how to best design and manufacture vias for a diagonally wired integrated circuit.

SUMMARY OF THE INVENTION

A system for creating efficient vias between metal layers in semiconductor designs that employ diagonal wiring is disclosed. The system combines advantages of both octagonal shaped vias and square shaped vias. Specifically, octagonal shaped vias are ideal for integrated circuit layouts that contain diagonal wiring since the diagonal wiring may be placed closer to the center of the via due to the beveled corners. However, octagonal vias are difficult to manufacture. Square vias have been traditionally used within integrated circuits and the techniques to manufacture square vias are well-known. Since the final manufactured output of an ideal square via is similar to the final output of an ideal octagonal via, one system that may be employed is to design an integrated circuit with octagonal vias and then replace those octagonal shaped vias with square vias just before manufacturing. The replacement square vias must be chose to produce an output shape that is very similar to the output of the ideal octagonal via.

Other objects, features, and advantages of present invention will be apparent from the company drawings and from the following detailed description.

BRIEF DESCRIPTION OF THE DRAWINGS

The objects, features, and advantages of the present invention will be apparent to one skilled in the art, in view of the following detailed description in which.

DETAILED DESCRIPTION OF THE PREFERRED EMBODIMENT

A method and apparatus for creating efficient vias between metal layers in semiconductor designs and layouts is disclosed. In the following description, for purposes of explanation, specific nomenclature is set forth to provide a thorough understanding of the present invention. However, it will be apparent to one skilled in the art that these specific details are not required in order to practice the present invention. For example, the present invention has been described with reference to optical lithography. However, the same techniques can easily be applied to other types of semiconductor processes such as X-ray lithography, Extreme UV lithography, electron beam manufacturing, and focused ion beam manufacturing.

Diagonal Routing With Square Vias

Figure 1A:
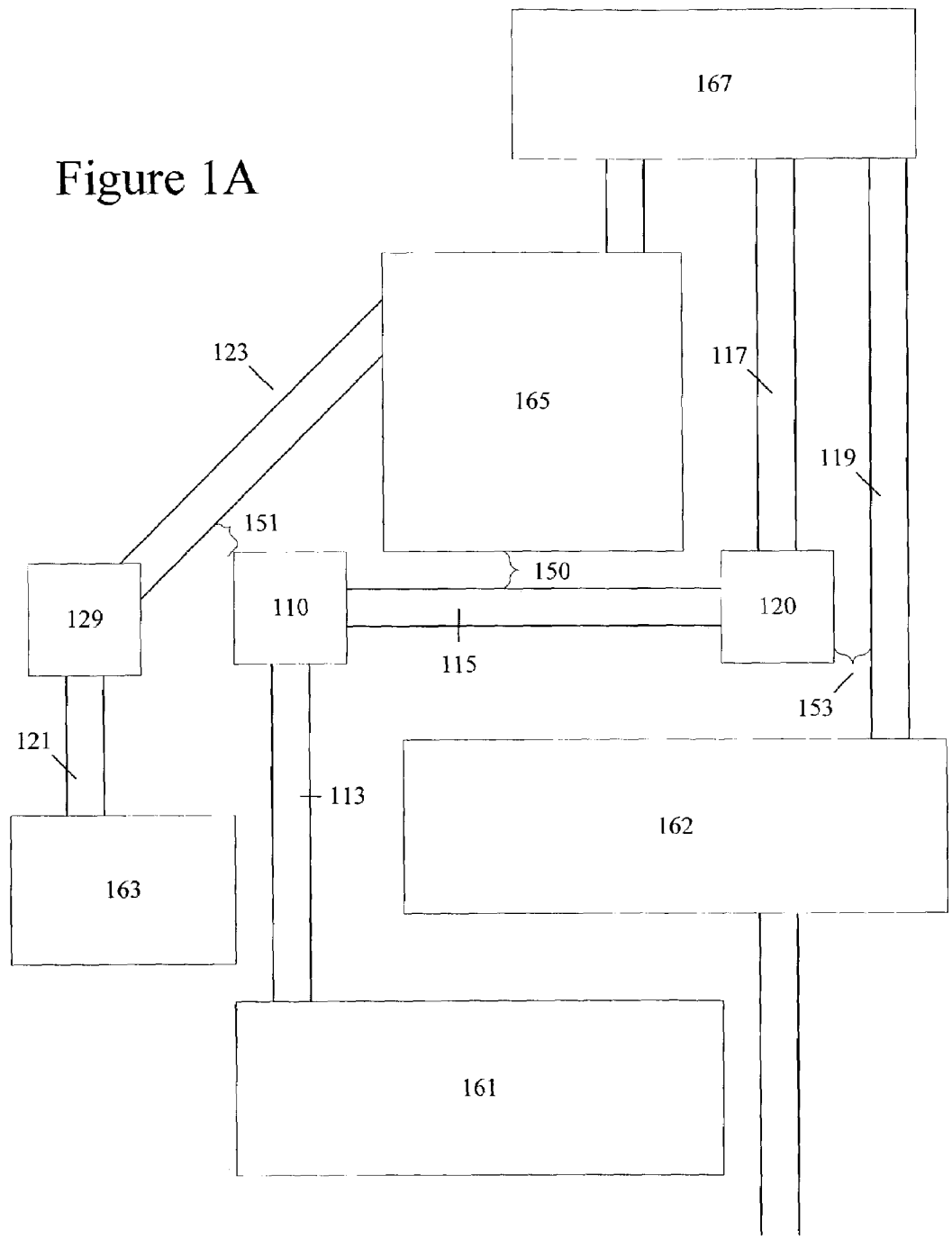
FIG. 1A illustrates a small area of a diagonally routed integrated circuit that has square vias.

FIG. 1A illustrates an example of a small area of an integrated circuit that has been routed with diagonal wiring. Referring to FIG. 1A, circuit blocks 161 and 167 are coupled together by Manhattan wires 113, 115, and 117 that route around circuit block 162. In most integrated circuits, the metal wiring layers have a 'preferred' wiring direction such that most of the wires on that layer are oriented in the same direction (horizontal, vertical, diagonal, etc.). Thus vertical wires 113 and 117 may be on one metal wiring layer and horizontal wire 115 is on another metal wiring layer. To connect the wires, vias 110 and 120 are used.

To prevent crosstalk and manufacturing defects, the features on an integrated circuit must be kept some minimum distance apart. Thus, a gap 150 separates circuit block 165 from horizontal wire 115. Similarly, gap 153 separates vertical wire 119 from via 120. Note that since via 120 is square, vertical wire 119 can be kept a consistent distance away from via 120 since vertical wire 119 is parallel to the edge of the square.

However, with diagonal wires, the situation is not so simple. Referring to FIG. 1A, vertical wire 121 and diagonal wire 123 couple together circuit blocks 163 and 165. Diagonal wire 123 passes near via 110. To manufacture the integrated circuit reliably, there must be a defined minimum gap 151 between diagonal wire 123 and via 110. Since the upper-left corner of the square via 110 is closest to diagonal wire 123, that upper-left corner must be separated from the diagonal wire 123 by the minimum gap distance. In such an arrangement, a significant amount of unused area remains above and to the left of the via 110.

Diagonal Routing With Octagonal Vias

Figure 2A:
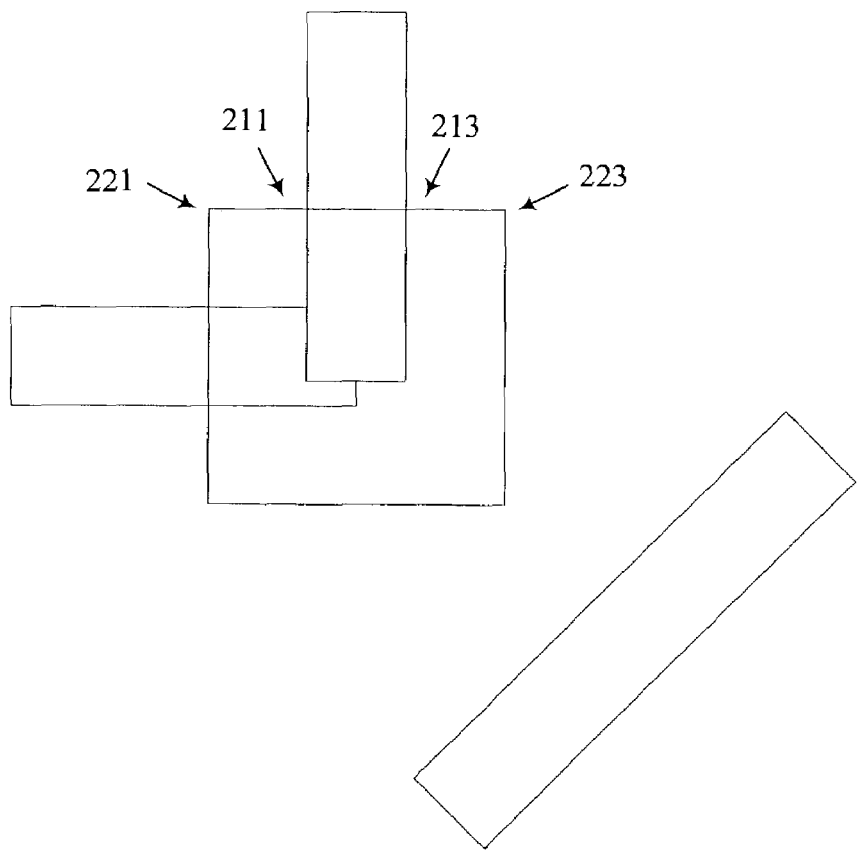
FIG. 2A illustrates a close-up view of a square via that couples a horizontal wire and vertical wire on two different layers.

To improve the wiring density, octagonal vias may be used to connect wiring on different metal layers. FIG. 2A illustrates a close-up view of a square via used to couple a vertical and a horizontal wire. Note that the corner of the square via must be kept a defined minimum distance from a nearby diagonal wiring segment.

Figure 2B:
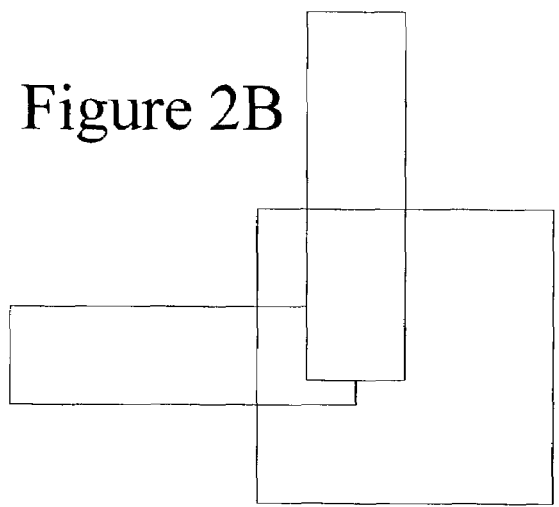
FIG. 2B illustrates a close-up view of an offset square via that couples a horizontal wire and vertical wire on two different layers.

As previously set forth, the via is made larger than the wires in order to accommodate any inaccuracies during manufacture. For example, FIG. 2B illustrates the arrangement of the square via wherein the via is accidentally shifted to the right. However, both wires are completely covered by the via such that there is electrical continuity. Note that it is the areas near the wires such as area 211 and area 213 that matter most. The far off corner areas 221 and 223 are not as important.

Figure 2C:
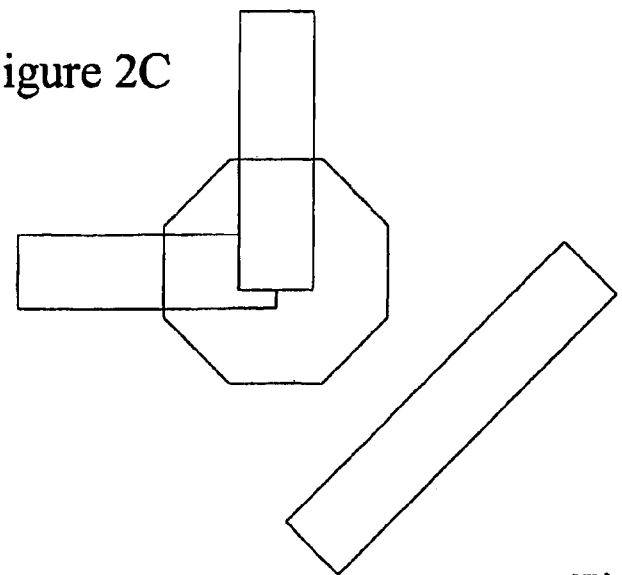
FIG. 2C illustrates a close-up view of an octagonal via that couples a horizontal wire and vertical wire on two different layers.
Figure 2D:
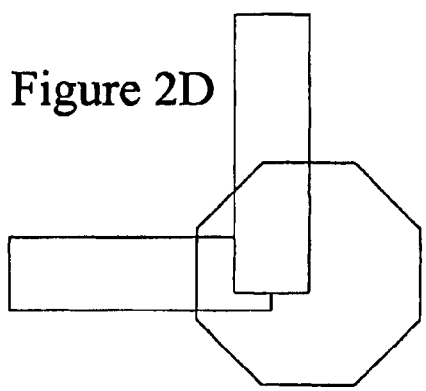
FIG. 2D illustrates a close-up view of an offset octagonal via that couples a horizontal wire and vertical wire on two different layers.

Since the corners are not that important, the corners may be removed from the via. FIG. 2C illustrates the close-up view of a via used to couple a vertical and a horizontal wire of FIG. 2A wherein the square via has been replaced with an octagonal via. As illustrated in FIG. 2C, the beveled edge of the diagonal via allows diagonal wire can be closer to the center of the via while keeping the minimum required distance between the two features. Thus, octagonal vias allow a diagonally wired integrated circuit to achieve a higher wiring density.

Figure 2E:
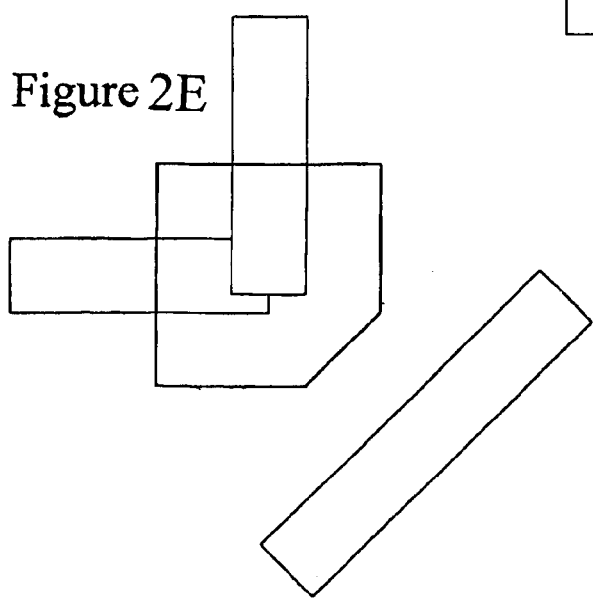
FIG. 2E illustrates an example of a via that comprises a square with one corner proximate to a diagonal wire beveled off to allow the diagonal wire to be placed closer to the via.

The vias need not be octagonal to achieve the desired effect. For example, the same effect can be achieved by beveling the corners off vias that are proximate to diagonal wires. FIG. 2E illustrates an example of a via that comprises a square with one corner proximate to a diagonal wire beveled off to allow the diagonal wire to be placed closer to the via.

Figure 1B:
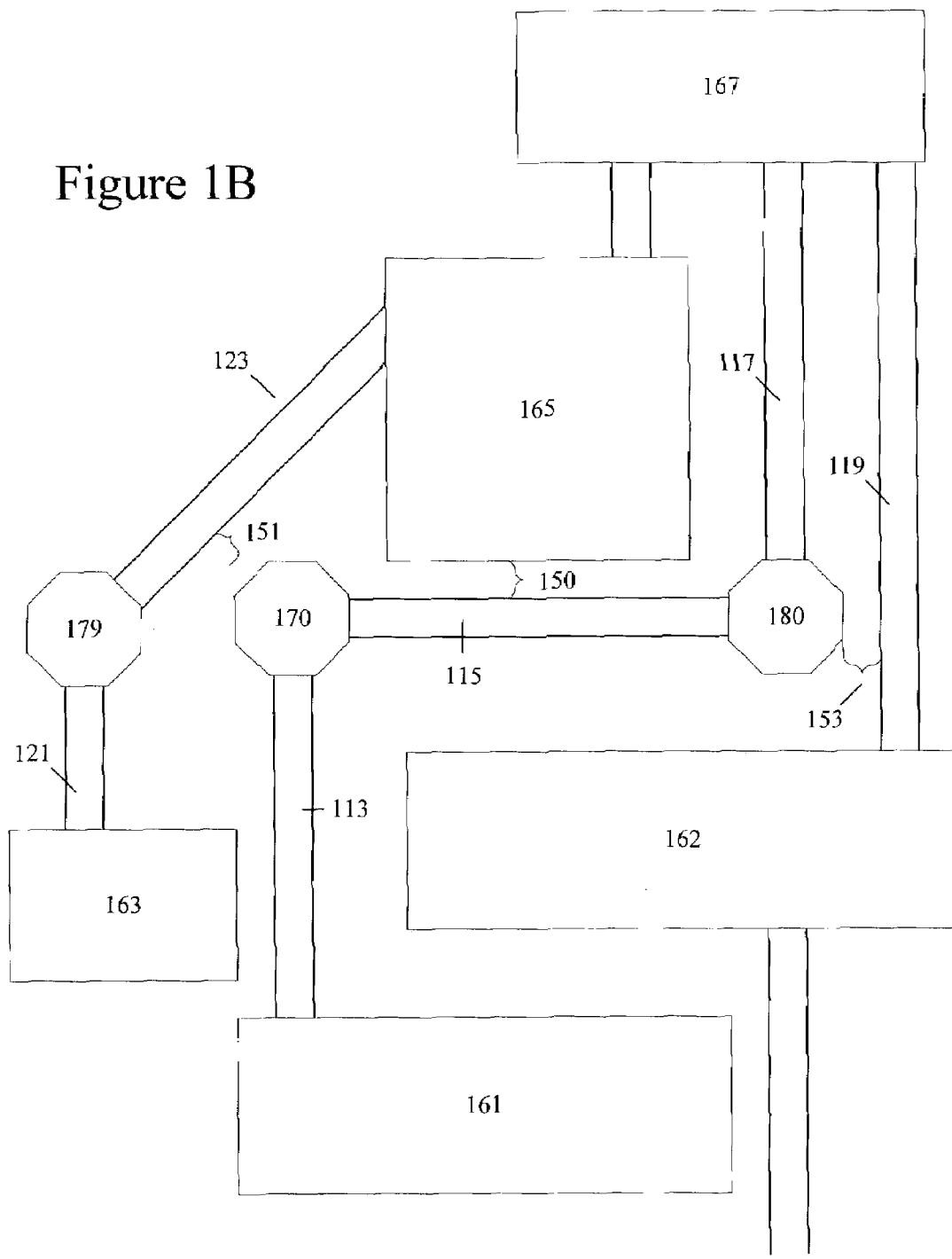
FIG. 1B illustrates the small area of a diagonally routed integrated circuit of FIG. 1A wherein the square vias have been replaced with octagonal vias.

FIG. 1B illustrates the section of integrated circuit wiring from FIG. 1A with square vias 120, 130, and 129 replaced with octagonal vias 170, 180, and 179, respectively. As seen in FIG. 1B, the use of octagonal vias reduces congestion in the integrated circuit layout.

Mask Creation with Octagonal Vias

As set forth in the previous section, a diagonally integrated circuit layout that uses octagonal vias may achieve higher density. However, it has been determined that the creation of diagonal vias with current optical lithography tools is not a trivial process.

Figure 3A:
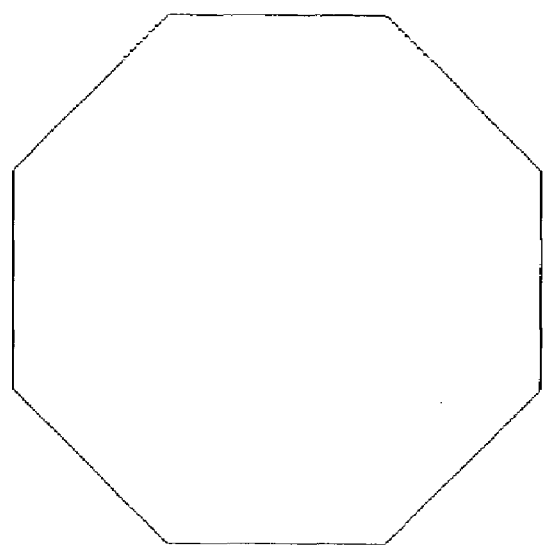
FIG. 3A illustrates an example of an octagonal via.
Figure 3B:
FIG. 3B illustrates three simple polygons that may be output when a photomask creation program divides the octagonal via of FIG. 3A.
Figure 3B:
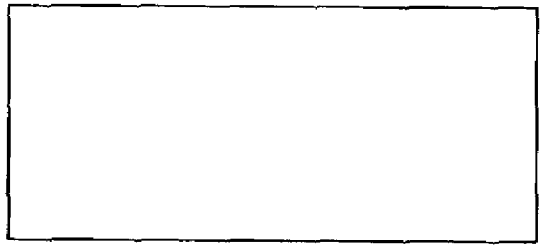
Figure 3B:
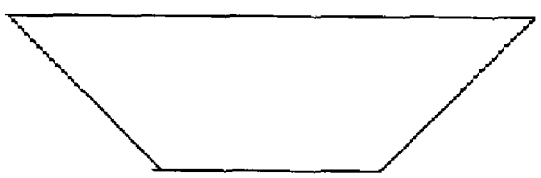

One difficulty in using diagonal vias with the current optical lithography tools is the creation of an optical lithography mask. When creating an optical lithography mask, the mask creation software divides all complex polygons into smaller simpler polygons. This process will cause all octagonal vias to be divided into simpler polygons. For example, FIG. 3A illustrates an octagonal via and FIG. 3B illustrates three simple polygons that the mask creation software will output after dividing the octagonal via. With a normal square via, the mask creation software will not divide the via.

Since approximately half the polygons in an integrated circuit layout may be vias, dividing the vias into three separate polygons will greatly increase the amount of polygons that need to be processed. The greatly increased polygon count makes the amount of data to be processed unwieldy. Thus, it would be desirable to find another method of solving the problem.

Geometry Changes During Semiconductor Manufacture

Semiconductor manufacturers produce semiconductor integrated circuits using optical lithography. Optical lithography is a specialized printing process that creates detailed geometric patterns onto silicon wafers. Semiconductor manufacturers first create a "mask" that will be used as a template for creating an integrated circuit layer. The mask is created from an ideal circuit design created by EDA software. Once a mask has been created, the semiconductor manufacturer then shines light through the mask to project a desired pattern onto a silicon wafer that is coated with a very thin layer of photosensitive material called "resist." The bright parts of the image pattern cause chemical reactions that make the resist material become soluble. After development, the resist forms a stenciled geometric pattern across the wafer surface that closely matches the desired pattern of the semiconductor integrated circuit. Finally, this pattern is transferred onto the wafer surface via another chemical process.

The creation of semiconductor integrated circuits with optical lithography is not an exact science. Various different errors are introduced during different steps of the process such that the actual integrated circuit produced appears very different that the ideal design created by the EDA software. An example of this will be presented with reference to FIGS. 4A, 4B, and 4C.

Figure 4A:
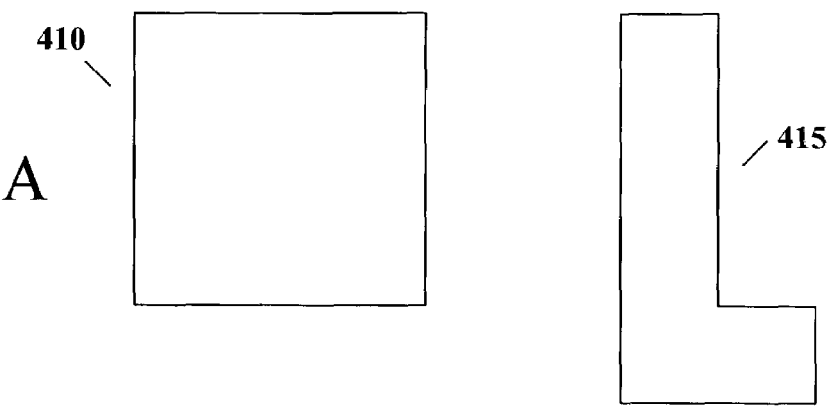
FIG. 4A illustrates a pair of ideal geometric features for an integrated circuit as created by EDA software.
Figure 4B:
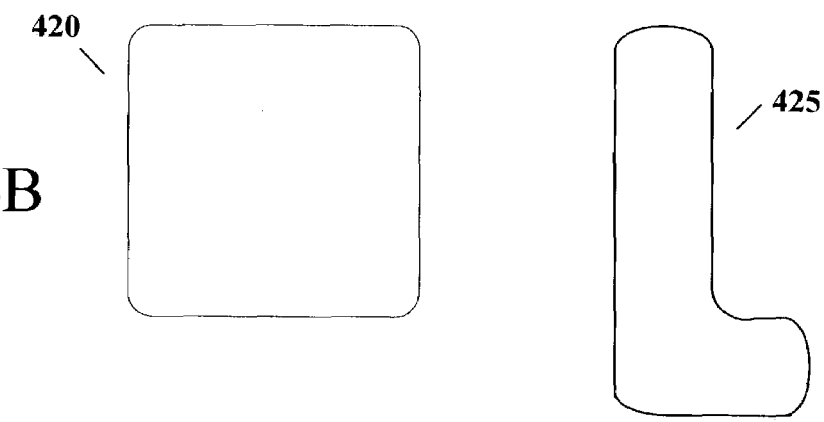
FIG. 4B illustrates a mask created for the ideal geometric features of FIG. 4A.

FIG. 4A illustrates an ideal pair of geometric features to be etched into a silicon wafer. Specifically, FIG. 4A illustrates a square via 410 and an "L" shaped feature. When a photomask is created, the photomask is not a perfect representation of the ideal geometric feature. For example, FIG. 4B illustrates how a photomask of the ideal geometric features illustrated in FIG. 4A may appear. As illustrated, the photomask is not a perfect representation of the ideal circuit feature.

Figure 4C:
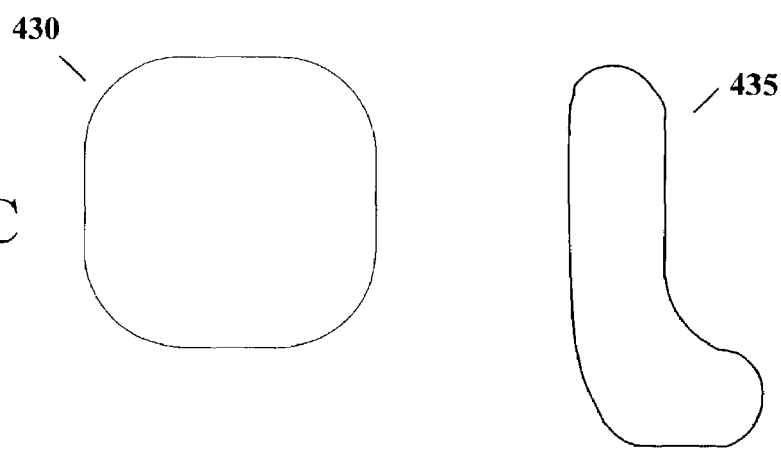
FIG. 4C illustrates how the actual circuit features may appear when created in the photoresist of a silicon wafer using the mask of FIG. 4B.

When the photomask is then used in optical lithography, the pattern projected onto the semiconductor will not be an exact duplicate of the photomask. Certain physical phenomenon such as diffraction (the bending of light around edges) will alter the shape of the pattern projected onto the semiconductor. Thus, for example, when the photomask of FIG. 4B is used in the optical lithography process the final output semiconductor integrated circuit may appear as illustrated in FIG. 4C. Note that the outside corners of the final output features become have become shortened and rounded. Thus, the output features of the final semiconductor integrated circuit FIG. 4C only appears to be an approximate similarity to the ideal output features of FIG. 4A. This is especially true at today's semiconductor processes that are straining the limitations of optical lithography.

As illustrated in FIG. 4C, the final output shape from a square via appears similar to an octagon. Since, the output is similar to an octagonal shaped via it was determined that one may use an octagonal shaped via during the integrated circuit design phase and then substitute the octagonal shaped in the integrated circuit design via with the easier to manufacture square shaped via. In this manner, both the reduced congestion advantage of octagonal shaped vias and the advantage of easy to manufacture square vias can be used.

Determining the Proper Sized Replacement Square Via

In order to replace octagonal shaped vias with a square shaped vias, the proper sized square via must be determined. One method of the determining the proper size of square via to use will be disclosed with reference to FIGS. 5 and 6A to 6D.

Figure 5:
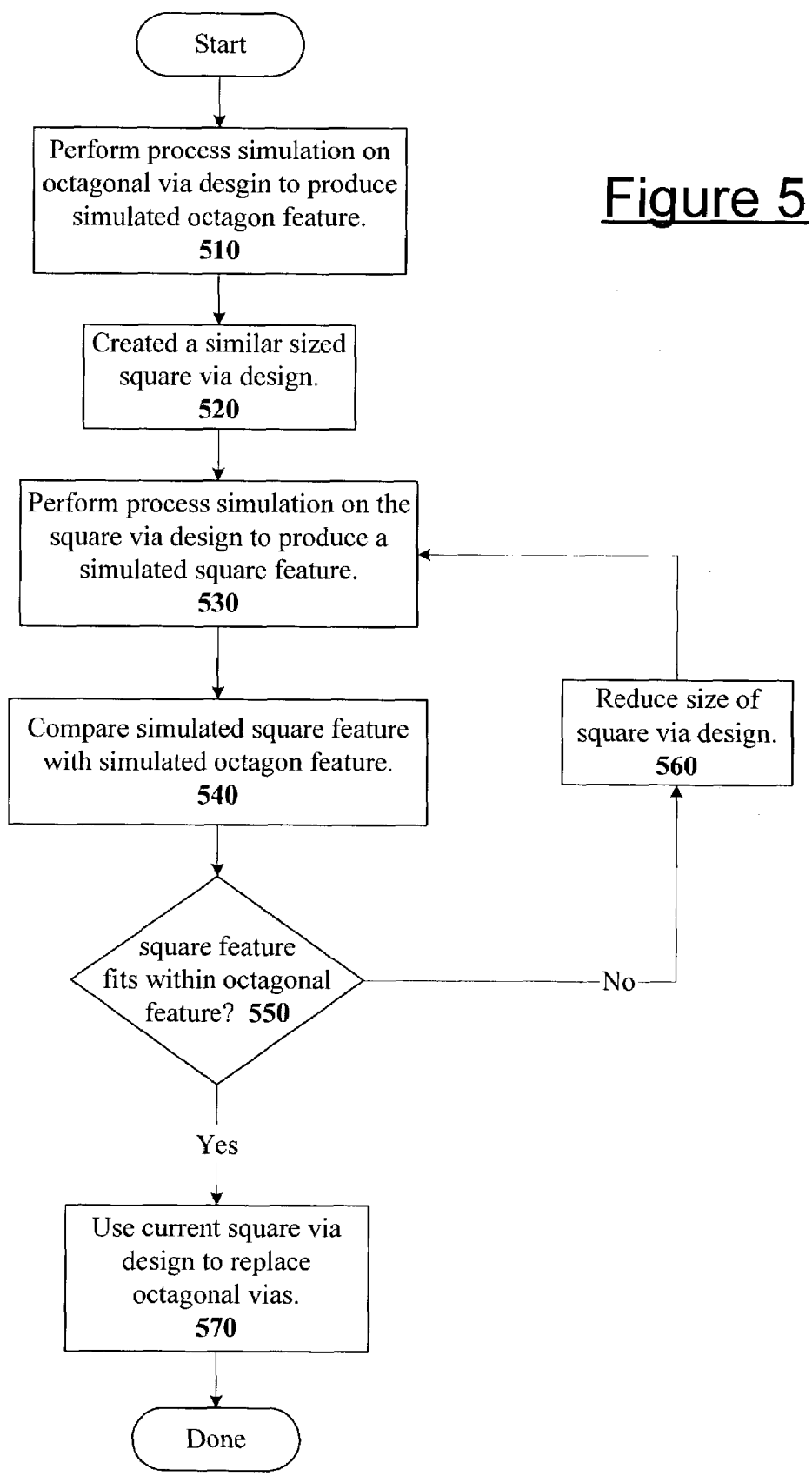
FIG. 5 illustrates a flow diagram that describes one method of selecting a square via size that will be used to replace octagonal vias.
Figure 6A:
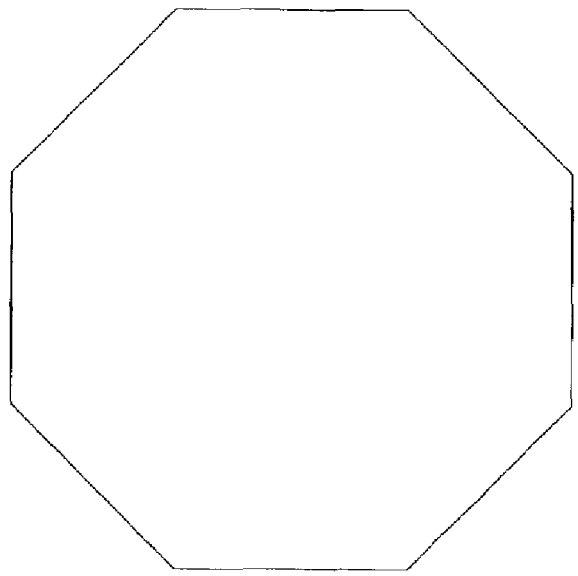
FIG. 6A illustrates an ideal octagonal via from an integrated circuit design.
Figure 6B:
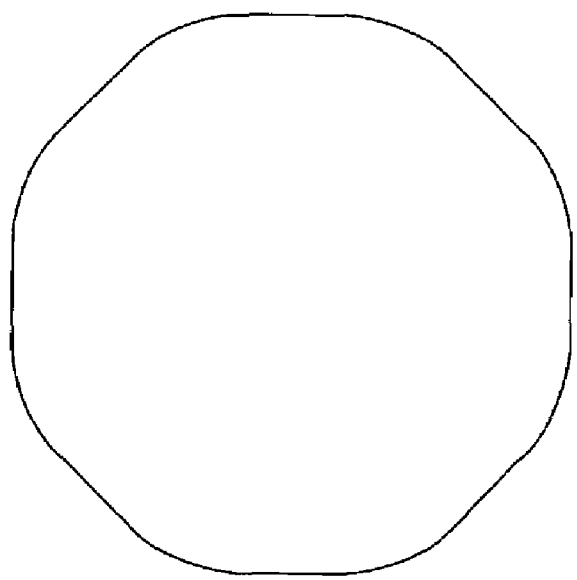
FIG. 6B illustrates one possible output feature that may be produced from performing a process simulation on the ideal octagonal via of FIG. 6A.

Referring to FIG. 5, the first step 510 is to perform a process simulation on an octagonal via in order to determine the final output shape that will be created from the ideal octagonal via in an integrated circuit design. A process simulator is highly accurate computer program that replicates the physics of a particular semiconductor manufacturing process. For example, the exact diffraction patterns created by the particular wavelength of light that is used will be accurately modeled in order to produce the final feature. FIG. 6A illustrates an example of an ideal octagonal via shape. After the process simulator has simulated the semiconductor manufacturing process, the final output feature may appear as illustrated in FIG. 6B. Note that the final output feature has rounded corners.

Next, at step 520, a similar sized ideal square via is created. The initial square via to be tested may be the square that encompasses the octagonal via. Then at step 530, the process simulator is applied to the ideal square via to generate the output feature created when the process is applied to the ideal square via of an integrated circuit design. As previously set forth, the final output feature will likely appear as illustrated in FIG. 4C.

Figure 6C:
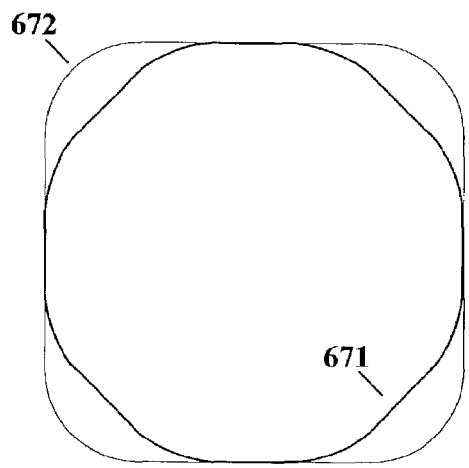
FIG. 6C illustrates an output feature from a square via that is too large to fit within the output feature from an octagonal via.
Figure 6D:
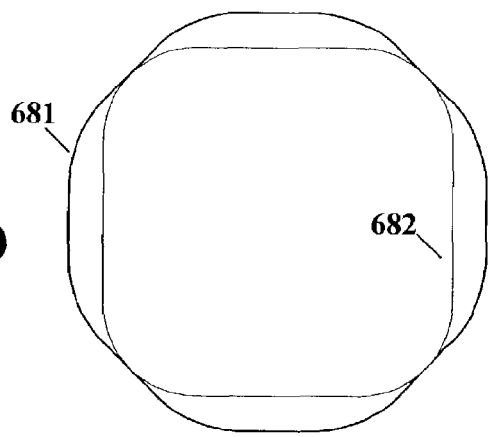
FIG. 6D illustrates an output feature from a square via that fits perfectly within the output feature from an octagonal via.

Next, at step 540, the octagonal output feature and the square output feature are compared. If the output feature from the square via does not fit within the output feature from the octagonal feature, then the method proceeds to step 560 to try a smaller square via size. If the initial selected ideal square via size encompasses the octagonal via then the initial square output feature will likely encompass the octagonal feature. This situation is illustrated in FIG. 6C wherein the square output feature 672 from an initial square via completely encompasses the octagonal feature output 671 feature. The method would then gradually reduce the size of the ideal square via at step 560 and repeat steps 530 and 540. This process repeats until the output feature from the square via fits within the output feature from the octagonal via. This situation is illustrated in FIG. 6D wherein the square output feature 682 is completely enclosed within the octagonal feature output 681 feature such that the method proceeds to step 570 wherein that ideal square via size is selected to replace octagonal vias in integrated circuit designs.

Figure 6E:
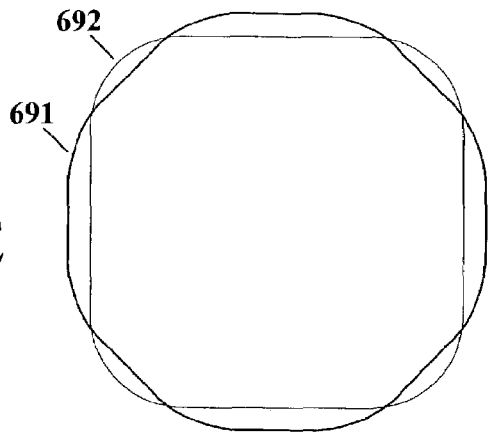
FIG. 6E illustrates an output feature from an ideal square via that may be considered within an acceptable tolerance limit of an octagonal via.

The system of FIG. 5 is designed to select the largest square via that will produce an output feature that fits within the octagonal output feature of the octagonal via. However, other variations may be used. For example, a system may instead select any ideal via shape that produces an output feature that is within a predefined tolerance limit size of the output feature from the octagonal feature. For example, FIG. 6E illustrates an output feature from an ideal square via 692 that may be considered within an acceptable tolerance limit of the octagonal feature 691. In one embodiment, the output from the square via is not allowed to be larger than the octagonal output feature by more than 5% along the two diagonal axes of the output features. This will prevent the output via from being too close to any adjacent diagonal wiring.

Using Octagonal Design Vias and Replacement Square Vias

Figure 7:
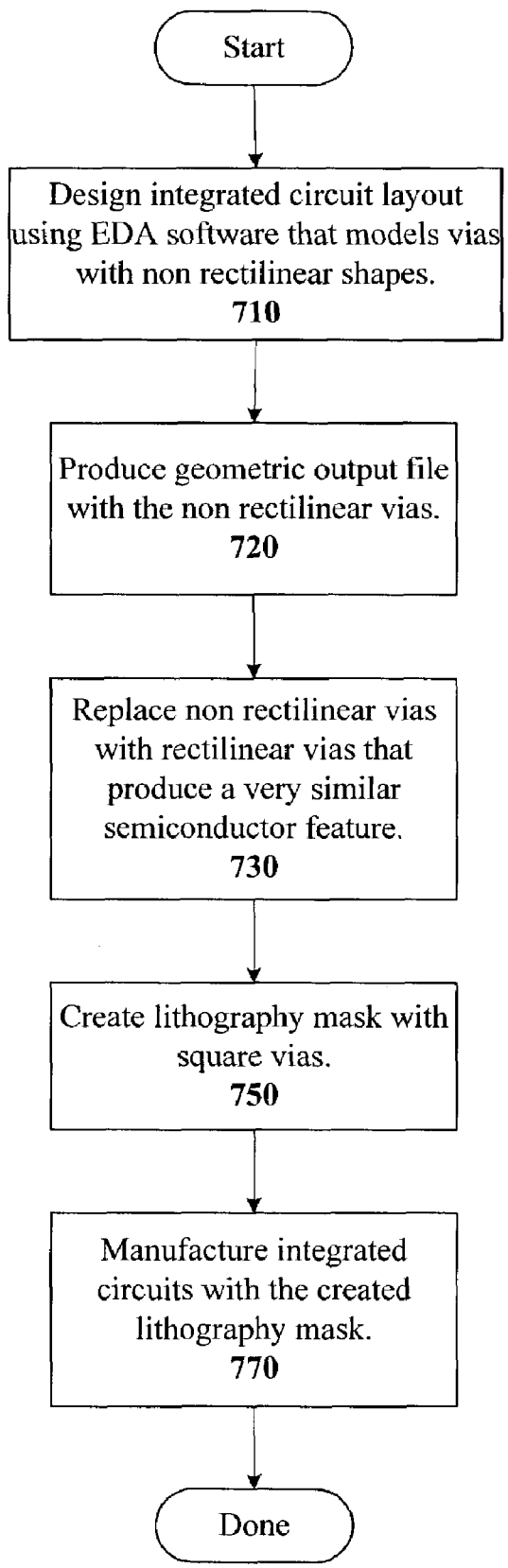
FIG. 7 illustrates a flow diagram for creating integrated circuits with octagonal vias in a design stage and square vias in a manufacturing stage.

Once a proper sized square replacement via has been selected, the system of using octagonal vias within a design phase and rectilinear vias within a manufacturing phase may be implemented. One embodiment of such a system is illustrated with reference to the flow diagram of FIG. 7.

Initially, at step 710, circuit designers create an integrated circuit layout with Electronic Design Automation (EDA) software that models vias with non rectilinear shapes. In one embodiment octagonal shaped vias are used. However, other non rectilinear shapes such as squares with beveled corners that are near diagonal lines may be used as previously set forth. Circular via models may also be used.

Next, at step 720, a geometric output file is created from the integrated circuit layout. The geometric output file will contain the non rectilinear via shapes. In one embodiment, the output file may be a GDS2 file. Then, at step 730, all the non rectilinear vias in the geometric output file are replaced with the replacement rectilinear vias that produce a very similar output feature. The rectilinear square vias will simplify the tasks of creating the photomask and manufacturing the integrated circuit.

At step 750, a lithography photomask is created from the geometric output file containing the rectilinear square vias. Finally, at step 770, integrated circuits are manufactured from the created lithography photomask.

Other Possible Changes to the Semiconductor Design Process

Other changes to the semiconductor design and manufacturing process may be needed to adapt to the use of non rectilinear vias. For example, an integrated circuit layout may be processed by a design rule check (DRC) stage that ensures that the integrated circuit layout does not violate any design rules that have been created in order to ensure the integrated circuit can be manufactured reliably. For example, one design rule may state that all different geometric features must be kept a minimum distance apart. When the non rectilinear vias are replaced with rectilinear vias, the rectilinear vias may cause a design rule violation. To prevent such problems, the design rules may be changed or the design rule checking system may be instructed to ignore vias.

Another step used in some integrated circuit design systems is optical proximity correction (OPC). Optical proximity correction systems often attempt to anticipate problems created by diffraction and compensate for such problems. For example, an optical proximity correction system may anticipate the rounded shapes of FIG. 4C that are created instead of sharp corners in FIG. 4A and attempt to compensate for such effects. Many optical proximity correction systems add serifs to geometric features such that the added serifs may compensate for the diffraction. Such added serifs may cause problems with the via replacement system of the present invention. To prevent such problems, an optical proximity correction system may be instructed to not change the shape of the rectilinear vias since those rectilinear vias were already specifically chosen to create the desired octagonal-like output feature.

The foregoing has described a method for creating efficient vias between metal layers in semiconductor designs that employ diagonal wiring. It is contemplated that changes and modifications may be made by one of ordinary skill in the art, to the materials and arrangements of elements of the present invention without departing from the scope of the invention.

We claim:

1. A method of preparing a semiconductor mask, said method comprising:

designing an integrated circuit layout containing non rectilinearly shaped vias;

after designing said integrated circuit layout containing non rectilinearly shaped vias, replacing said non rectilinearly shaped vias in said integrated circuit layout with replacement rectilinearly shaped vias, in order to simplify producing said semiconductor mask; and producing said semiconductor mask from said integrated circuit layout with said replacement rectilinearly shaped vias.

2. The method of preparing a semiconductor mask as claimed in claim 1 wherein said non rectilinearly shaped vias comprise octagon shaped vias.

3. The method of preparing a semiconductor mask as claimed in claim 1, wherein said non rectilinearly shaped vias comprise rectilinearly shaped vias having edges proximate nearby diagonal wiring.

4. The method of preparing a semiconductor mask as claimed in claim 1, wherein said rectilinearly shaped vias comprise square shaped vias.

5. The method of preparing a semiconductor mask as claimed in claim 1, said method further comprising:

producing a geometric output file containing said non rectilinearly shaped vias.

6. The method of claim 1, wherein said replacement rectilinearly shaped vias approximate the shape of said non rectilinearly shaped vias within a predefined tolerance.

7. A computer readable medium, said computer readable medium storing computer program code for performing the steps of:

locating non rectilinearly shaped vias in an integrated circuit layout; and replacing said non rectilinearly shaped vias in said integrated circuit layout with replacement rectilinearly shaped vias.

8. The computer readable medium as claimed in claim 7, wherein said non rectilinearly shaped vias comprise octagon shaped vias.

9. The computer readable medium as claimed in claim 7, wherein said rectilinearly shaped vias comprise square shaped vias.

10. The computer readable medium as claimed in claim 7, wherein said non rectilinearly shaped vias comprise rectilinearly shaped vias having edges proximate nearby diagonal wiring.

11. A method of manufacturing an integrated circuit (IC) by using an IC layout comprising non rectilinearly shaped vias, said method comprising:

determining a first output feature from a non rectilinearly shaped via design, wherein an output feature comprises a shape of the via in an IC manufactured by using said IC layout;

determining a second output feature from a test rectilinearly shaped via design;

comparing said first output feature with said second output feature; and replacing said non rectilinearly shaped via design with said test rectilinearly shaped via design if said second output feature is within a predefined tolerance of said first output feature.

12. The method as claimed in claim 11, wherein said predefined tolerance comprises said second output feature completely enclosed by said first output feature.

13. The method as claimed in claim 11, wherein said predefined tolerance comprises said second output feature not larger than a defined amount along a diagonal axis of said first output feature.

14. The method as claimed in claim 13, wherein said defined amount comprises five per cent.

15. The method as claimed in claim 11, wherein said method repeats said steps of determining a second output feature from a test rectilinearly shaped via design and comparing said first output feature with said second output feature.

16. The method as claimed in claim 11, wherein said non rectilinearly shaped vias comprise octagon shaped vias.

17. The method as claimed in claim 10, wherein said rectilinearly shaped vias comprise square shaped vias.

* * * * *

UNITED STATES PATENT AND TRADEMARK OFFICE
CERTIFICATE OF CORRECTION

PATENT NO. : 7,263,677 B1
APPLICATION NO. : 10/335246
DATED : August 28, 2007
INVENTOR(S) : Steven Teig et al.

It is certified that error appears in the above-identified patent and that said Letters Patent is hereby corrected as shown below:

Title Page item 57, Abstract (Abstract) reads "A system for creating efficient vias between metal layers in semiconductor designs that employ diagonal wiring is disclosed. The system combines advantages of both octagonal shaped vias and square shaped vias. Specifically, octagonal shaped vias are ideal for integrated circuit layouts that contain diagonal wiring since the diagonal wiring may be placed closer to the center the via due to the bevel corners. However, octagonal vias are difficult to manufacture. Square vias have been traditionally used within integrated circuits and the techniques to manufacture square vias are well-known. Since the final manufactured output of an ideal square via is similar to the final output of an ideal octagonal via, one system that may be employed is to design an integrated circuit with octagonal vias and then replace those octagonal shaped vias with square vias just before manufacturing. The replacement square vias must be chose to produce an output shape that is very similar to the output of the ideal octagonal via."

Should read (correction of Abstract) -- A system for creating efficient vias between metal layers in semiconductor designs that employ diagonal wiring is disclosed. The system combines advantages of both octagonal shaped vias and square vias. Specifically, octagonal shaped vias are ideal for integrated circuit layouts that contain diagonal wiring since the diagonal wiring may be placed closer to the center of the via due to the beveled corners. However, octagonal vias are difficult to manufacture. Square vias have been traditionally used within integrated circuits and the techniques to manufacture square vias are well-known. Since the final manufactured output of an ideal square via is similar to the final output of an ideal octagonal via, one system that may be employed is to design an integrated circuit with octagonal vias and then replace those octagonal shaped vias with square vias just before manufacturing. The replacement square vias must be chosen to produce an output shape that is very similar to the output of the ideal octagonal via. --

Column 1

Lines 64-66 (background of the invention) reads "For example, the corners of a square shaped via do not provide much help in connecting wires those corners may cause design rule violations by being too close to nearby diagonal wires."

Should read (correction of background of the invention) -- For example, the corners of a square shaped via do not provide much help in connecting wires those corners may cause design rule violations by being too close to nearby diagonal wires." --

UNITED STATES PATENT AND TRADEMARK OFFICE
CERTIFICATE OF CORRECTION

| | | |
|---|---|---|
| PATENT NO. | : 7,263,677 B1 | |
| APPLICATION NO. | : 10/335246 | |
| DATED | : August 28, 2007 | |
| INVENTOR(S) | : Steven Teig et al. | |

It is certified that error appears in the above-identified patent and that said Letters Patent is hereby corrected as shown below:

Column 2

Lines 9-13 (summary) reads "Specifically, octagonal shaped vias are ideal for integrated circuit layouts that contain diagonal wiring since the diagonal wiring may be placed closer to the center of the via due to the beveled comers."

Should read (correction of summary) -- "Specifically, octagonal shaped vias are ideal for integrated circuit layouts that contain diagonal wiring since the diagonal wiring may be placed closer to the center of the via due to the beveled corners. --

Column 2

Lines 21-26 (Summary) reads "The replacement square vias must be chose to produce an output shape that is very similar to the output of the ideal octagonal via. Other objects, features, and advantages of present invention will be apparent from the company drawings and from the following detailed description."

Should read (correction of Summary) -- The replacement square vias must be chosen to produce an output shape that is very similar to the output of the ideal octagonal via. Other objects, features, and advantages of the present invention will be apparent from the company drawings and from the following detailed description. --

Column 4

Line 21 (specification) reads "Since the comers are not that important, the corners may"

Should read (correction of specification) -- Since the corners are not that important, the corners may --

Column 4

Figure 1C:
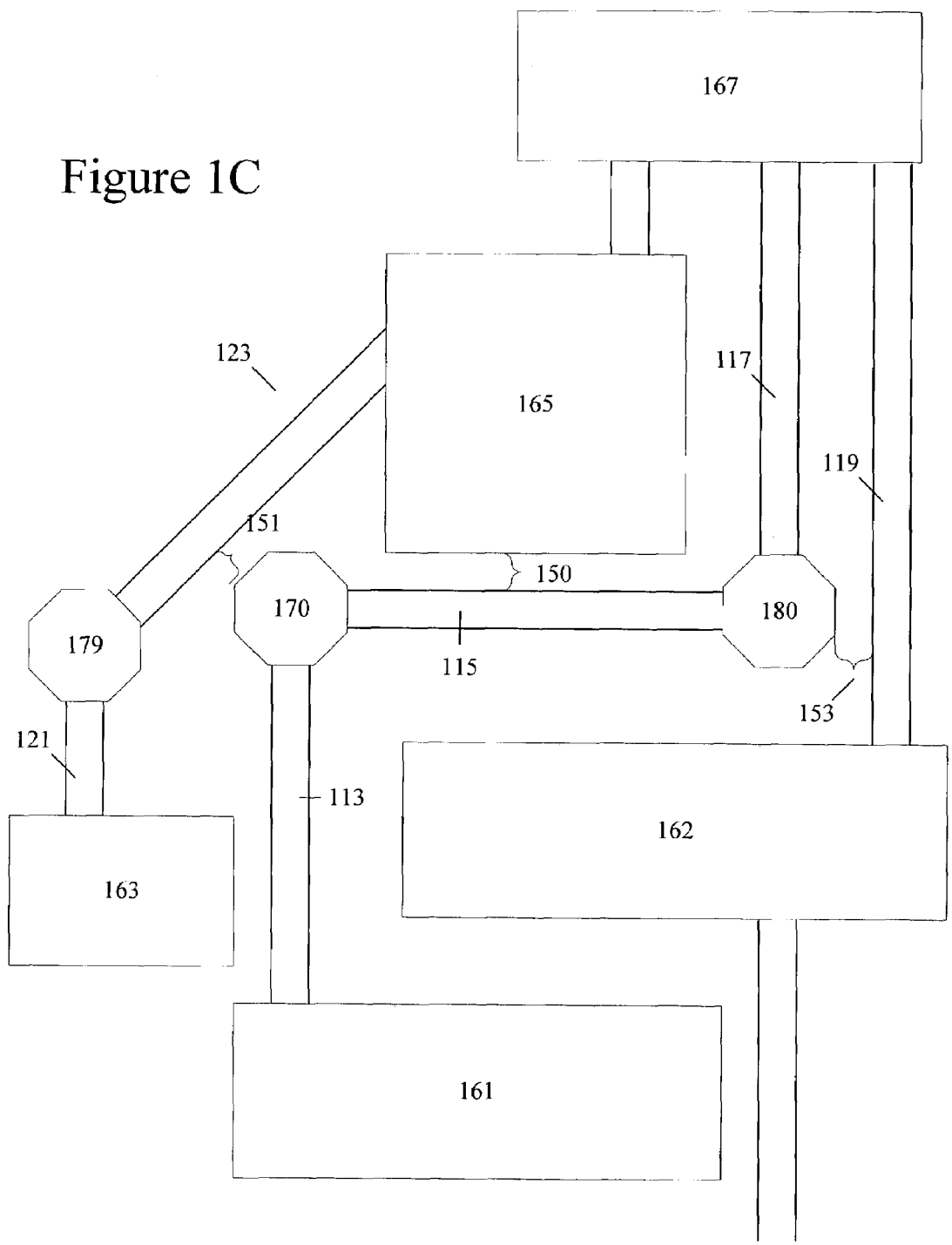
FIG. 1C illustrates the small area of a diagonally routed integrated circuit of FIG. 1B wherein diagonal wire 123 has been moved closer to via 170 due the via's octagonal shape.

After the paragraph ending on line 42, please insert the following paragraph: -- Due to the reduced congestion, the integrated circuit may be packed more tightly. For example, Figure 1C illustrates the integrated circuit of Figure 1B but with diagonal wire 123 moved closer to octagonal via 170 due to the use of octagonal via shape. --

UNITED STATES PATENT AND TRADEMARK OFFICE
CERTIFICATE OF CORRECTION

| | |
|---|---|
| PATENT NO. | : 7,263,677 B1 |
| APPLICATION NO. | : 10/335246 |
| DATED | : August 28, 2007 |
| INVENTOR(S) | : Steven Teig et al. |

It is certified that error appears in the above-identified patent and that said Letters Patent is hereby corrected as shown below:

Column 8

Lines 11-13 (claim) reads "2. The method of preparing a semiconductor mask as claimed in claim 1 wherein said non rectilinearly shaped vias comprise octagon shaped vias."

Should read (correction of claim) -- 2. The method of preparing a semiconductor mask as claimed in claim 1, wherein said non rectilinearly shaped vias comprise octagon shaped vias. --

Column 10

Lines 3-4 (claim) reads "17. The method as claimed in claim 10, wherein said rectilinearly shaped vias comprise square shaped vias."

Should read (correction of claim) -- 17. The method as claimed in claim 11, wherein said rectilinearly shaped vias comprise square shaped vias. --

Signed and Sealed this

Fifteenth Day of July, 2008

JON W. DUDAS
*Director of the United States Patent and Trademark Office*